(12) United States Patent
Katkar et al.

(10) Patent No.: US 9,825,002 B2
(45) Date of Patent: *Nov. 21, 2017

(54) FLIPPED DIE STACK

(71) Applicant: Invensas Corporation, San Jose, CA (US)

(72) Inventors: Rajesh Katkar, San Jose, CA (US); Reynaldo Co, Santa Cruz, CA (US); Scott McGrath, Scotts Valley, CA (US); Ashok S. Prabhu, San Jose, CA (US); Sangil Lee, Santa Clara, CA (US); Liang Wang, Milpitas, CA (US); Hong Shen, Palo Alto, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/208,985

(22) Filed: Jul. 13, 2016

(65) Prior Publication Data

US 2017/0018529 A1 Jan. 19, 2017

Related U.S. Application Data

(60) Provisional application No. 62/194,051, filed on Jul. 17, 2015.

(51) Int. Cl.
*H01L 21/56* (2006.01)
*H01L 25/065* (2006.01)
(Continued)

(52) U.S. Cl.
CPC .......... *H01L 25/0652* (2013.01); *H01L 24/96* (2013.01); *H01L 24/97* (2013.01);
(Continued)

(58) Field of Classification Search
CPC ... H01L 25/50; H01L 21/563; H01L 25/0652; H01L 24/97; H01L 24/96; H01L 25/0657;
(Continued)

(56) References Cited

U.S. PATENT DOCUMENTS 3,639,888 A 2/1972 Pittman et al.
4,323,914 A 4/1982 Berndlmaier et al.
(Continued)

FOREIGN PATENT DOCUMENTS

CN 2512114 Y 9/2002
CN 1531069 A 9/2004
(Continued)

OTHER PUBLICATIONS

International Search Report for Application No. PCT/US2016/062304 dated Mar. 6, 2017.
(Continued)

*Primary Examiner* — Bitew Dinke
(74) *Attorney, Agent, or Firm* — Lerner, David, Littenberg, Krumholz & Mentlik, LLP

(57) ABSTRACT

A microelectronic assembly includes a stack of semiconductor chips each having a front surface defining a respective plane of a plurality of planes. A chip terminal may extend from a contact at a front surface of each chip in a direction towards the edge surface of the respective chip. The chip stack is mounted to substrate at an angle such that edge surfaces of the chips face a major surface of the substrate that defines a second plane that is transverse to, i.e., not parallel to the plurality of parallel planes. An electrically conductive material electrically connects the chip terminals with corresponding substrate contacts.

12 Claims, 9 Drawing Sheets

(51) Int. Cl.
*H01L 25/00* (2006.01)
*H01L 23/00* (2006.01)

(52) U.S. Cl.
CPC .... *H01L 25/50* (2013.01); *H01L 2224/04105* (2013.01); *H01L 2224/12105* (2013.01); *H01L 2224/32145* (2013.01); *H01L 2224/32225* (2013.01); *H01L 2224/73267* (2013.01); *H01L 2224/83005* (2013.01); *H01L 2225/06506* (2013.01); *H01L 2225/06555* (2013.01); *H01L 2225/06582* (2013.01); *H01L 2225/06589* (2013.01); *H01L 2225/06596* (2013.01); *H01L 2924/1032* (2013.01); *H01L 2924/1037* (2013.01); *H01L 2924/10252* (2013.01); *H01L 2924/10253* (2013.01); *H01L 2924/10329* (2013.01); *H01L 2924/1436* (2013.01); *H01L 2924/1438* (2013.01); *H01L 2924/18162* (2013.01); *H01L 2924/19107* (2013.01)

(58) Field of Classification Search
CPC ............ H01L 23/49551; H01L 25/105; H01L 23/49555; H01L 24/48; H01L 24/85; H01L 24/49; H01L 24/45; H01L 24/29; H01L 24/32; H01L 24/83; H01L 24/09
See application file for complete search history.

(56) References Cited

U.S. PATENT DOCUMENTS

| | | | |
|---|---|---|---|
| 4,336,551 A | 6/1982 | Fujita et al. | |
| 4,363,076 A | 12/1982 | McIver | |
| 4,500,905 A | 2/1985 | Shibata | |
| 4,706,166 A | 11/1987 | Go | |
| 4,726,777 A | 2/1988 | Billman et al. | |
| 4,784,972 A | 11/1988 | Hatada | |
| 4,951,122 A | 8/1990 | Tsubosaki et al. | |
| 4,967,262 A | 10/1990 | Farnsworth | |
| 5,047,837 A | 9/1991 | Kitano et al. | |
| 5,107,325 A | 4/1992 | Nakayoshi | |
| 5,138,438 A | 8/1992 | Masayuki et al. | |
| 5,200,362 A | 4/1993 | Lin et al. | |
| 5,218,234 A | 6/1993 | Thompson et al. | |
| 5,239,447 A * | 8/1993 | Cotues | H01L 24/49 257/686 |
| 5,304,737 A | 4/1994 | Kim | |
| 5,311,401 A | 5/1994 | Gates, Jr. et al. | |
| 5,327,327 A * | 7/1994 | Frew | H01L 25/0657 174/255 |
| 5,331,591 A | 7/1994 | Clifton | |
| 5,334,872 A | 8/1994 | Ueda et al. | |
| 5,347,428 A | 9/1994 | Carson et al. | |
| 5,365,106 A | 11/1994 | Watanabe | |
| 5,434,745 A | 7/1995 | Shokrgozar et al. | |
| 5,466,634 A | 11/1995 | Beilstein, Jr. et al. | |
| 5,534,729 A | 7/1996 | Russell | |
| 5,538,758 A | 7/1996 | Beach et al. | |
| 5,571,754 A | 11/1996 | Bertin et al. | |
| 5,592,019 A | 1/1997 | Ueda et al. | |
| 5,616,953 A | 4/1997 | King et al. | |
| 5,629,566 A | 5/1997 | Doi et al. | |
| 5,675,180 A | 10/1997 | Pedersen et al. | |
| 5,691,248 A | 11/1997 | Cronin et al. | |
| 5,698,895 A | 12/1997 | Pedersen et al. | |
| 5,716,759 A | 2/1998 | Badehi | |
| 5,721,151 A | 2/1998 | Padmanabhan et al. | |
| 5,731,631 A | 3/1998 | Yama et al. | |
| 5,737,191 A | 4/1998 | Horiuchi et al. | |
| 5,801,448 A * | 9/1998 | Ball | H01L 25/0657 257/685 |
| 5,870,351 A | 2/1999 | Ladabaum et al. | |
| 5,879,965 A | 3/1999 | Jiang et al. | |
| 5,891,761 A | 4/1999 | Vindasius et al. | |
| 5,910,687 A | 6/1999 | Chen et al. | |
| 5,946,545 A | 8/1999 | Bertin et al. | |
| 5,965,947 A | 10/1999 | Nam et al. | |
| 6,005,776 A * | 12/1999 | Holman | H01L 25/0657 257/E25.013 |
| 6,030,854 A | 2/2000 | Mashimoto et al. | |
| 6,034,438 A | 3/2000 | Petersen | |
| 6,071,139 A | 6/2000 | Corisis et al. | |
| 6,087,716 A | 7/2000 | Ikeda | |
| 6,088,237 A * | 7/2000 | Farnworth | H01R 12/89 257/686 |
| 6,107,164 A | 8/2000 | Ohuchi | |
| 6,175,158 B1 | 1/2001 | Degani et al. | |
| 6,225,689 B1 | 5/2001 | Moden et al. | |
| 6,228,686 B1 | 5/2001 | Smith et al. | |
| 6,255,726 B1 | 7/2001 | Vindasius et al. | |
| 6,262,476 B1 | 7/2001 | Vidal | |
| 6,271,598 B1 | 8/2001 | Vindasius et al. | |
| 6,297,657 B1 | 10/2001 | Thiessen et al. | |
| 6,303,977 B1 | 10/2001 | Schroen et al. | |
| 6,315,856 B1 | 11/2001 | Asagiri et al. | |
| 6,320,253 B1 * | 11/2001 | Kinsman | H01L 23/32 257/686 |
| 6,326,244 B1 | 12/2001 | Brooks et al. | |
| 6,326,689 B1 | 12/2001 | Thomas | |
| 6,338,980 B1 | 1/2002 | Satoh | |
| 6,351,030 B2 | 2/2002 | Havens et al. | |
| 6,418,033 B1 * | 7/2002 | Rinne | H01L 25/0657 257/685 |
| 6,472,744 B1 * | 10/2002 | Sato | H01L 25/105 257/723 |
| 6,472,746 B2 | 10/2002 | Taniguchi et al. | |
| 6,473,291 B1 | 10/2002 | Stevenson | |
| 6,476,467 B2 | 11/2002 | Nakamura et al. | |
| 6,566,760 B1 | 5/2003 | Kawamura et al. | |
| 6,569,709 B2 | 5/2003 | Derderian | |
| D475,981 S | 6/2003 | Michii | |
| 6,580,165 B1 | 6/2003 | Singh | |
| 6,582,992 B2 | 6/2003 | Poo et al. | |
| 6,593,648 B2 | 7/2003 | Emoto | |
| 6,607,938 B2 | 8/2003 | Kwon et al. | |
| 6,607,941 B2 | 8/2003 | Prabhu et al. | |
| 6,621,155 B1 | 9/2003 | Perino et al. | |
| 6,621,172 B2 | 9/2003 | Nakayama et al. | |
| 6,624,505 B2 | 9/2003 | Badehi | |
| 6,656,827 B1 | 12/2003 | Tsao et al. | |
| 6,667,543 B1 | 12/2003 | Chow et al. | |
| 6,670,701 B2 | 12/2003 | Matsuura et al. | |
| 6,674,159 B1 | 1/2004 | Peterson et al. | |
| 6,686,655 B2 | 2/2004 | Moden et al. | |
| 6,706,971 B2 | 3/2004 | Albert et al. | |
| 6,710,246 B1 | 3/2004 | Mostafazadeh et al. | |
| 6,717,061 B2 | 4/2004 | Yamaguchi et al. | |
| 6,722,213 B2 | 4/2004 | Offen et al. | |
| 6,730,997 B2 | 5/2004 | Beyne et al. | |
| 6,737,743 B2 | 5/2004 | Urakawa | |
| 6,747,348 B2 | 6/2004 | Jeung et al. | |
| 6,750,547 B2 | 6/2004 | Jeung et al. | |
| 6,756,252 B2 | 6/2004 | Nakanishi | |
| 6,777,767 B2 | 8/2004 | Badehi | |
| 6,802,446 B2 | 10/2004 | Chaudhuri et al. | |
| 6,844,623 B1 | 1/2005 | Peterson et al. | |
| 6,849,802 B2 | 2/2005 | Song et al. | |
| 6,853,557 B1 | 2/2005 | Haba et al. | |
| 6,908,784 B1 | 6/2005 | Farnworth et al. | |
| 6,910,268 B2 | 6/2005 | Miller | |
| 6,940,022 B1 | 9/2005 | Vinciarelli et al. | |
| 6,956,283 B1 | 10/2005 | Peterson | |
| 6,964,915 B2 | 11/2005 | Farnworth et al. | |
| 6,972,480 B2 | 12/2005 | Zilber et al. | |
| 6,973,718 B2 | 12/2005 | Sheppard, Jr. et al. | |
| 6,984,885 B1 | 1/2006 | Harada et al. | |
| 7,005,324 B2 | 2/2006 | Imai | |
| 7,029,949 B2 | 4/2006 | Farnworth et al. | |
| 7,061,125 B2 | 6/2006 | Cho et al. | |
| 7,115,986 B2 | 10/2006 | Moon et al. | |
| 7,125,750 B2 | 10/2006 | Kwan et al. | |
| 7,127,807 B2 | 10/2006 | Yamaguchi et al. | |
| 7,180,168 B2 | 2/2007 | Imai | |
| 7,190,060 B1 | 3/2007 | Chiang | |

(56) References Cited

U.S. PATENT DOCUMENTS

| | | | |
|---|---|---|---|
| 7,196,262 B2 | 3/2007 | Gronet | |
| 7,208,335 B2 | 4/2007 | Boon et al. | |
| 7,208,345 B2 | 4/2007 | Meyer et al. | |
| 7,215,018 B2 | 5/2007 | Vindasius et al. | |
| 7,221,051 B2 | 5/2007 | Ono et al. | |
| 7,245,021 B2 | 7/2007 | Vindasius et al. | |
| 7,259,455 B2 | 8/2007 | Seto | |
| 7,279,363 B2 | 10/2007 | Cherukuri et al. | |
| 7,285,865 B2 | 10/2007 | Kwon et al. | |
| 7,335,533 B2 | 2/2008 | Derderian | |
| 7,344,917 B2 | 3/2008 | Gautham | |
| 7,355,274 B2 | 4/2008 | Lim | |
| 7,402,911 B2 | 7/2008 | Thomas et al. | |
| 7,405,138 B2 | 7/2008 | Ohuchi et al. | |
| 7,408,243 B2 | 8/2008 | Shiffer | |
| 7,429,782 B2 | 9/2008 | Brunnbauer et al. | |
| 7,452,743 B2 | 11/2008 | Oliver et al. | |
| 7,514,350 B2 | 4/2009 | Hashimoto | |
| 7,521,288 B2 | 4/2009 | Arai et al. | |
| 7,535,109 B2 | 5/2009 | Robinson et al. | |
| 7,564,142 B2 | 7/2009 | Hashimoto | |
| 7,595,222 B2 | 9/2009 | Shimoishizaka et al. | |
| 7,601,039 B2 | 10/2009 | Eldridge et al. | |
| 7,638,869 B2 | 12/2009 | Irsigler et al. | |
| 7,662,670 B2 | 2/2010 | Noma et al. | |
| 7,662,671 B2 | 2/2010 | Saeki | |
| 7,704,794 B2 | 4/2010 | Mess et al. | |
| 7,732,912 B2 | 6/2010 | Damberg | |
| 7,768,795 B2 | 8/2010 | Sakurai et al. | |
| 7,829,438 B2 | 11/2010 | Haba et al. | |
| 7,863,159 B2 | 1/2011 | Co et al. | |
| 7,888,185 B2 | 2/2011 | Corisis et al. | |
| 7,901,989 B2 | 3/2011 | Haba et al. | |
| 7,919,846 B2 | 4/2011 | Hembree | |
| 7,923,349 B2 | 4/2011 | McElrea et al. | |
| 7,951,649 B2 | 5/2011 | Val | |
| 7,952,195 B2 | 5/2011 | Haba | |
| 8,022,527 B2 | 9/2011 | Haba et al. | |
| 8,040,682 B2 * | 10/2011 | Shimoda | H01L 23/36 257/678 |
| 8,076,788 B2 | 12/2011 | Haba et al. | |
| 8,178,978 B2 | 5/2012 | McElrea et al. | |
| 8,373,280 B2 | 2/2013 | Harada et al. | |
| 8,390,109 B2 | 3/2013 | Popovic et al. | |
| 8,431,435 B2 | 4/2013 | Haba et al. | |
| 8,551,815 B2 | 10/2013 | Avsian et al. | |
| 8,618,659 B2 | 12/2013 | Sato et al. | |
| 8,619,659 B2 | 12/2013 | Lee et al. | |
| 8,629,543 B2 | 1/2014 | McElrea et al. | |
| 8,633,576 B2 | 1/2014 | Zohni et al. | |
| 8,674,482 B2 | 3/2014 | Shi et al. | |
| 8,704,379 B2 | 4/2014 | Crane et al. | |
| 8,723,332 B2 | 5/2014 | McElrea et al. | |
| 8,772,920 B2 * | 7/2014 | Thacker | H01L 24/13 257/686 |
| 8,952,514 B2 | 2/2015 | Chun | |
| 9,123,418 B2 | 9/2015 | Lin et al. | |
| 9,136,251 B2 | 9/2015 | Cheah et al. | |
| 9,490,195 B1 * | 11/2016 | Prabhu | H01L 23/49575 |
| 9,508,691 B1 * | 11/2016 | Delacruz | H01L 24/48 |
| 2001/0012725 A1 | 8/2001 | Maeda et al. | |
| 2001/0031548 A1 | 10/2001 | Elenius et al. | |
| 2002/0006686 A1 | 1/2002 | Cloud et al. | |
| 2002/0027257 A1 | 3/2002 | Kinsman et al. | |
| 2002/0045290 A1 | 4/2002 | Ball | |
| 2002/0096349 A1 | 7/2002 | Hedler et al. | |
| 2002/0127775 A1 | 9/2002 | Haba et al. | |
| 2002/0168798 A1 | 11/2002 | Glenn et al. | |
| 2002/0180010 A1 | 12/2002 | Tsubosaki et al. | |
| 2002/0185725 A1 | 12/2002 | Moden et al. | |
| 2002/0187260 A1 | 12/2002 | Sheppard et al. | |
| 2002/0190368 A1 | 12/2002 | Shimoe et al. | |
| 2003/0038353 A1 | 2/2003 | Derderian | |
| 2003/0038356 A1 | 2/2003 | Derderian | |
| 2003/0038357 A1 | 2/2003 | Derderian | |
| 2003/0060034 A1 | 3/2003 | Beyne et al. | |
| 2003/0071338 A1 | 4/2003 | Jeung et al. | |
| 2003/0071341 A1 | 4/2003 | Jeung et al. | |
| 2003/0080403 A1 | 5/2003 | Jeung et al. | |
| 2003/0092326 A1 | 5/2003 | Nishikawa et al. | |
| 2003/0096454 A1 | 5/2003 | Poo et al. | |
| 2003/0099085 A1 | 5/2003 | Duva | |
| 2003/0122243 A1 | 7/2003 | Lee et al. | |
| 2003/0143819 A1 | 7/2003 | Hedler et al. | |
| 2003/0148597 A1 | 8/2003 | Tan et al. | |
| 2003/0162369 A1 | 8/2003 | Kobayashi | |
| 2003/0209772 A1 | 11/2003 | Prabhu | |
| 2004/0113283 A1 | 6/2004 | Farnworth et al. | |
| 2004/0142509 A1 | 7/2004 | Imai | |
| 2004/0150095 A1 | 8/2004 | Fraley et al. | |
| 2004/0173892 A1 | 9/2004 | Nakanishi | |
| 2004/0195667 A1 | 10/2004 | Karnezos | |
| 2004/0198033 A1 | 10/2004 | Lee et al. | |
| 2004/0212083 A1 | 10/2004 | Yang | |
| 2004/0217446 A1 | 11/2004 | Headley et al. | |
| 2004/0227235 A1 | 11/2004 | Hashimoto | |
| 2004/0238933 A1 | 12/2004 | Chen et al. | |
| 2004/0251520 A1 | 12/2004 | Sasaki et al. | |
| 2004/0262035 A1 | 12/2004 | Ko et al. | |
| 2005/0013927 A1 | 1/2005 | Yamazaki | |
| 2005/0067680 A1 | 3/2005 | Boon et al. | |
| 2005/0067694 A1 | 3/2005 | Pon et al. | |
| 2005/0082651 A1 | 4/2005 | Farnworth et al. | |
| 2005/0085050 A1 | 4/2005 | Draney et al. | |
| 2005/0101039 A1 | 5/2005 | Chen et al. | |
| 2005/0104179 A1 | 5/2005 | Zilber et al. | |
| 2005/0121758 A1 | 6/2005 | Di Stefano | |
| 2005/0135067 A1 * | 6/2005 | Park | H01L 25/0655 361/715 |
| 2005/0148160 A1 | 7/2005 | Farnworth et al. | |
| 2005/0156323 A1 | 7/2005 | Tokunaga | |
| 2005/0230802 A1 | 10/2005 | Vindasius et al. | |
| 2005/0248021 A1 | 11/2005 | Morkner | |
| 2005/0258530 A1 | 11/2005 | Vindasius et al. | |
| 2005/0287705 A1 | 12/2005 | Yang | |
| 2005/0287709 A1 | 12/2005 | Lee et al. | |
| 2006/0003552 A1 | 1/2006 | Okada | |
| 2006/0035408 A1 | 2/2006 | Derderian | |
| 2006/0046436 A1 | 3/2006 | Ohuchi et al. | |
| 2006/0055050 A1 | 3/2006 | Numata et al. | |
| 2006/0068567 A1 | 3/2006 | Beyne et al. | |
| 2006/0076690 A1 | 4/2006 | Khandros et al. | |
| 2006/0094165 A1 | 5/2006 | Hedler et al. | |
| 2006/0097356 A1 | 5/2006 | Fujii et al. | |
| 2006/0103000 A1 | 5/2006 | Kurosawa | |
| 2006/0121645 A1 | 6/2006 | Ball | |
| 2006/0138626 A1 | 6/2006 | Liew et al. | |
| 2006/0220262 A1 | 10/2006 | Meyer et al. | |
| 2006/0233012 A1 | 10/2006 | Sekiguchi et al. | |
| 2006/0252180 A1 | 11/2006 | Moden et al. | |
| 2006/0267173 A1 | 11/2006 | Takiar et al. | |
| 2006/0273365 A1 | 12/2006 | Cross et al. | |
| 2006/0278971 A1 | 12/2006 | Barnes et al. | |
| 2007/0023900 A1 | 2/2007 | Toyoda | |
| 2007/0029684 A1 | 2/2007 | Arai et al. | |
| 2007/0065987 A1 | 3/2007 | Mess et al. | |
| 2007/0102801 A1 | 5/2007 | Ishida et al. | |
| 2007/0132082 A1 | 6/2007 | Tang et al. | |
| 2007/0158799 A1 | 7/2007 | Chiu et al. | |
| 2007/0158807 A1 | 7/2007 | Lu et al. | |
| 2007/0170572 A1 | 7/2007 | Liu et al. | |
| 2007/0181989 A1 | 8/2007 | Corisis et al. | |
| 2007/0187811 A1 | 8/2007 | Arai et al. | |
| 2007/0194462 A1 | 8/2007 | Kim et al. | |
| 2007/0222054 A1 | 9/2007 | Hembree | |
| 2007/0252262 A1 | 11/2007 | Robinson et al. | |
| 2007/0284716 A1 | 12/2007 | Vindasius et al. | |
| 2007/0290333 A1 | 12/2007 | Saini et al. | |
| 2008/0029866 A1 | 2/2008 | Kim et al. | |
| 2008/0029884 A1 | 2/2008 | Grafe et al. | |
| 2008/0083976 A1 | 4/2008 | Haba et al. | |
| 2008/0083977 A1 | 4/2008 | Haba et al. | |
| 2008/0094086 A1 | 4/2008 | Kim | |
| 2008/0112150 A1 | 5/2008 | Jones | |

(56) References Cited

U.S. PATENT DOCUMENTS

| | | |
|---|---|---|
| 2008/0150158 A1 | 6/2008 | Chin |
| 2008/0166836 A1 | 7/2008 | Jobetto |
| 2008/0173792 A1 | 7/2008 | Yang et al. |
| 2008/0180242 A1 | 7/2008 | Cottingham |
| 2008/0203566 A1 | 8/2008 | Su |
| 2008/0206915 A1 | 8/2008 | Yamazaki |
| 2008/0208043 A1 | 8/2008 | Smith et al. |
| 2008/0251913 A1 | 10/2008 | Inomata |
| 2008/0251939 A1 | 10/2008 | Chung et al. |
| 2008/0284044 A1 | 11/2008 | Myers |
| 2008/0290493 A1 | 11/2008 | Tsunozaki |
| 2008/0303131 A1 | 12/2008 | McElrea et al. |
| 2008/0308921 A1 | 12/2008 | Kim |
| 2008/0315407 A1 | 12/2008 | Andrews, Jr. et al. |
| 2009/0020887 A1 | 1/2009 | Mizuno et al. |
| 2009/0020889 A1 | 1/2009 | Murayama et al. |
| 2009/0045524 A1 | 2/2009 | Mohammed et al. |
| 2009/0065948 A1 | 3/2009 | Wang |
| 2009/0068790 A1 | 3/2009 | Caskey et al. |
| 2009/0102038 A1 | 4/2009 | McElrea et al. |
| 2009/0146137 A1 | 6/2009 | Kim et al. |
| 2009/0160065 A1 | 6/2009 | Haba et al. |
| 2009/0209061 A1 | 8/2009 | Jeong |
| 2009/0230528 A1 | 9/2009 | McElrea et al. |
| 2009/0316378 A1 | 12/2009 | Haba et al. |
| 2010/0140753 A1 | 6/2010 | Hembree |
| 2010/0140811 A1 | 6/2010 | Leal et al. |
| 2010/0148352 A1 | 6/2010 | Moden |
| 2010/0207277 A1 | 8/2010 | Bauer et al. |
| 2010/0327461 A1 | 12/2010 | Co et al. |
| 2011/0006432 A1 | 1/2011 | Haba et al. |
| 2011/0031629 A1 | 2/2011 | Haba et al. |
| 2011/0033979 A1 | 2/2011 | Haba et al. |
| 2011/0049696 A1 | 3/2011 | Haba et al. |
| 2011/0169154 A1 | 7/2011 | Kweon et al. |
| 2011/0187007 A1 | 8/2011 | Haba et al. |
| 2011/0248410 A1 | 10/2011 | Avsian et al. |
| 2011/0266684 A1 | 11/2011 | Leal |
| 2012/0049376 A1* | 3/2012 | Harada ............... H01L 24/32 257/773 |
| 2012/0051695 A1* | 3/2012 | Harada ............... G02B 6/43 385/39 |
| 2012/0056327 A1* | 3/2012 | Harada ............... H01L 23/544 257/773 |
| 2012/0061846 A1 | 3/2012 | Rathburn |
| 2012/0080807 A1 | 4/2012 | Haba et al. |
| 2012/0133057 A1 | 5/2012 | Haba et al. |
| 2012/0211878 A1* | 8/2012 | Popovic ............... H01L 24/05 257/690 |
| 2012/0313264 A1 | 12/2012 | Sato et al. |
| 2013/0083583 A1 | 4/2013 | Crisp et al. |
| 2013/0099392 A1 | 4/2013 | McElrea et al. |
| 2013/0099393 A1 | 4/2013 | Jeong et al. |
| 2013/0119542 A1 | 5/2013 | Oh |
| 2013/0154117 A1 | 6/2013 | Tan et al. |
| 2013/0286707 A1 | 10/2013 | Crisp et al. |
| 2013/0299977 A1* | 11/2013 | Dayringer ........... H01L 25/0652 257/738 |
| 2013/0336039 A1 | 12/2013 | Frans |
| 2013/0341803 A1 | 12/2013 | Cheah et al. |
| 2014/0070423 A1* | 3/2014 | Woychik ............... H01L 23/562 257/774 |
| 2014/0097526 A1 | 4/2014 | Suleiman et al. |
| 2014/0104786 A1 | 4/2014 | Clayton et al. |
| 2014/0264945 A1 | 9/2014 | Yap et al. |
| 2015/0098677 A1* | 4/2015 | Thacker ............... G02B 6/12 385/14 |
| 2015/0200181 A1 | 7/2015 | Haga et al. |
| 2016/0035698 A1 | 2/2016 | Lee et al. |
| 2016/0141232 A1 | 5/2016 | Cannon |
| 2017/0018485 A1* | 1/2017 | Prabhu ............... H01L 23/49537 |

FOREIGN PATENT DOCUMENTS

| | | |
|---|---|---|
| CN | 1638118 A | 7/2005 |
| CN | 1905148 A | 1/2007 |
| CN | 104332462 A | 2/2015 |
| DE | 102004039906 A1 | 8/2005 |
| EP | 1041624 A1 | 10/2000 |
| EP | 1763894 A2 | 3/2007 |
| EP | 2650880 A1 | 10/2013 |
| FR | 2704690 A1 | 11/1994 |
| JP | 07-509104 A | 10/1995 |
| JP | 11-260851 A | 9/1999 |
| JP | 2000269411 A | 9/2000 |
| JP | 2001210782 A | 8/2001 |
| JP | 2003-142518 A | 5/2003 |
| JP | 2003163324 A | 6/2003 |
| JP | 2004047702 A | 2/2004 |
| JP | 2004-119473 | 4/2004 |
| JP | 2004153130 A | 5/2004 |
| JP | 2004158536 A | 6/2004 |
| JP | 2004-214548 A | 7/2004 |
| JP | 2005005529 A | 1/2005 |
| JP | 2005026564 A | 1/2005 |
| JP | 2006-351793 A | 12/2006 |
| JP | 2007073803 A | 3/2007 |
| JP | 2007523482 A | 8/2007 |
| JP | 2008160119 A | 7/2008 |
| JP | 2008205453 A | 9/2008 |
| JP | 2008236688 A | 10/2008 |
| JP | 2009-026969 | 2/2009 |
| JP | 2009027039 A | 2/2009 |
| KR | 20-1994-0004952 | 7/1994 |
| KR | 10-1999-0008537 | 2/1999 |
| KR | 20010062722 A | 7/2001 |
| KR | 20050009036 A | 1/2005 |
| KR | 20070018057 A | 2/2007 |
| KR | 100813624 B1 | 3/2008 |
| KR | 20080045259 A | 5/2008 |
| KR | 20080069549 A | 7/2008 |
| KR | 20080091980 | 10/2008 |
| TW | 475244 | 2/2002 |
| TW | 200425356 A | 11/2004 |
| TW | 200504995 A | 2/2005 |
| TW | 200527549 A | 8/2005 |
| TW | 200605298 A | 2/2006 |
| TW | 200721471 | 6/2007 |
| TW | 200913208 A | 3/2009 |
| TW | 200940570 A | 10/2009 |
| WO | 9425987 A1 | 11/1994 |
| WO | 9907015 A1 | 2/1999 |
| WO | 9909599 A2 | 2/1999 |
| WO | 0164344 A2 | 9/2001 |
| WO | 2005081315 A2 | 9/2005 |
| WO | 2005101492 A2 | 10/2005 |
| WO | 2009032371 A1 | 3/2009 |
| WO | 2009052150 A1 | 4/2009 |
| WO | 2009114670 A2 | 9/2009 |
| WO | 2010057339 A1 | 5/2010 |

OTHER PUBLICATIONS

Cheah, Bok Eng, et al., Modeling and Electrical Characteristics Evaluation of Vertical Side-Chip Internconnection for Compact 3D Integration, School of Electrical and Electronic Engineering, Universiti Sains Malaysia, 13th Electronics Materials and Packaging (EMAP), Nov. 2011, 7 pages.

Han, Sang Wook, Wireless Interconnect using Inductive Coupling in 3D-ICs, University of Michigan, 2012, 133 pages.

Kong, J., et al., Sensitivity Study of Channel Termination on Vertical Side-Chip Interconnection, Universiti Sains Malaysia, 35th International Electronic Manufacturing Technology Conference, 2012, 6 pages.

U.S. Appl. No. 14/883,864, filed Oct. 15, 2015.

\* cited by examiner

FLIPPED DIE STACK

CROSS-REFERENCE TO RELATED APPLICATION

The present application claims the benefit of the filing date of U.S. Provisional Patent Application No. 62/194,051 filed Jul. 17, 2015, the disclosure of which is hereby incorporated herein by reference.

BACKGROUND OF THE INVENTION

Field of the Invention

The subject matter of this application relates to microelectronic packages and assemblies in which a plurality of semiconductor chips are stacked one above the other and electrically interconnected with a substrate such as a package element or other circuit panel.

Description of the Related Art

Semiconductor die or chips are flat bodies with contacts disposed on the front surface that are connected to the internal electrical circuitry of the chip itself. Semiconductor chips are typically packaged with substrates to form microelectronic packages having terminals that are electrically connected to the chip contacts. The package may then be connected to test equipment to determine whether the packaged device conforms to a desired performance standard. Once tested, the package may be connected to a larger circuit, e.g., a circuit in an electronic product such as a computer or a cell phone.

Microelectronic packages can include wafer level packages, which provide a package for a semiconductor component that is fabricated while the chips are still in a wafer form. The wafer is subjected to a number of additional process steps to form the package structure and the wafer is then diced to free the individual die or chips. Wafer level processing may provide a cost savings advantage. Furthermore, fan-out wafer-level packages can be fabricated by encapsulating edges of an array of semiconductor chips within a reconstituted wafer, and then performing additional processing to form fan-out traces and contacts.

In order to save space certain conventional designs have stacked multiple microelectronic elements or semiconductor chips within a package. This allows the package to occupy a surface area on a substrate that is less than the total surface area of the chips in the stack. However, conventional stacked packages have disadvantages of complexity, cost, thickness and testability.

In spite of the above advances, there remains a need for improved stacked packages and especially stacked chip packages which incorporate multiple chips for certain types of memory, e.g., flash memory. There is a need for such packages which are reliable, thin, testable and that are economical to manufacture.

DETAILED DESCRIPTION OF THE INVENTION

A microelectronic assembly may include a stack of semiconductor chips each having a front surface defining a respective plane of a plurality of planes. A chip terminal may extend from a contact at a front surface of each chip in a direction towards the edge surface of the respective chip. The chip stack is electrically coupled with a substrate contact at a major surface of a substrate or support element at an angle such that edge surfaces of the chips face a major surface of the substrate that defines a second plane that is transverse to, i.e., not parallel to the plurality of parallel planes. An electrically conductive material electrically connects the chip terminals with corresponding substrate contacts.

A method of fabricating a microelectronic assembly may include forming a chip stack including a plurality of semiconductor chips such that front surfaces of the chips define respective parallel planes. Each chip may have a plurality of contacts at its front surface and an edge surface extending away from the front surface of such chip. The chip stack may include a dielectric region extending between the front surface of a first chip and a front surface or a rear surface of a second chip adjacent to the first chip in the chip stack, the chip stack including a plurality of chip terminals each extending from a contact on one of the chips and having an end at a surface of the dielectric region. Then, electrical connections can be formed between the chip terminals and a plurality of corresponding substrate contacts at a major surface of a substrate. The major surface may define a second plane transverse to the plurality of parallel planes.

As used in this disclosure with reference to a dielectric region or a dielectric structure of a component, e.g., circuit structure, interposer, microelectronic element, capacitor, voltage regulator, circuit panel, substrate, etc., a statement that an electrically conductive element is "at" a surface of the dielectric region or component indicates that, when the surface is not covered or assembled with any other element, the electrically conductive element is available for contact with a theoretical point moving in a direction perpendicular to that surface of the dielectric region from outside the dielectric region or component. Thus, a terminal or other conductive element which is at a surface of a dielectric region may project from such surface; may be flush with such surface; or may be recessed relative to such surface in a hole or depression in the dielectric region.

Figure 1:
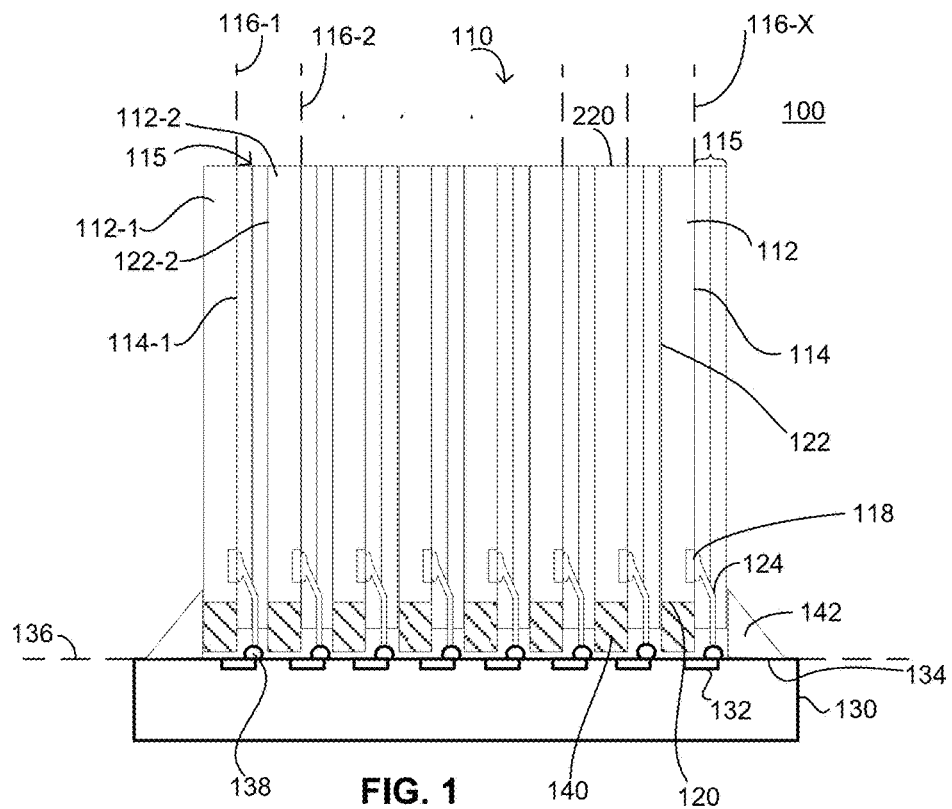
FIG. 1 is a sectional view depicting a microelectronic assembly in accordance with an embodiment of the invention.

FIG. 1 illustrates a microelectronic assembly in accordance with an embodiment of the invention. As seen in FIG. 1, microelectronic assembly 100 includes a chip stack 110 which includes a plurality of stacked semiconductor chips 112. In one example, each of the semiconductor chips may include one or more memory storage arrays, which may include a particular memory type such as nonvolatile memory. Nonvolatile memory can be implemented in a variety of technologies some of which include memory cells that incorporate floating gates, such as, for example, flash memory, and others which include memory cells which operate based on magnetic polarities. Flash memory chips are currently in widespread use as solid state storage as an alternative to magnetic fixed disk drives for computing and mobile devices. Flash memory chips are also commonly used in portable and readily interchangeable memory drives and cards, such as Universal Serial Bus (USB) memory drives, and memory cards such as Secure Digital or SD cards, microSD cards (trademarks or registered trademarks of SD-3C) and the like. Flash memory chips typically have NAND or NOR type devices therein; NAND type devices are common. Other examples of semiconductor chips 112 may also include one or more DRAM, NOR, microprocessor, controller die, etc. Each semiconductor chip may be implemented in one of various semiconductor materials such as silicon, germanium, gallium arsenide or other Groups III-V or Groups II-VI semiconductor compound, etc.

Each semiconductor chip has a front surface 114 defining a respective plane 116-$x$ of a plurality of planes 116-1, 116-2, etc. Each semiconductor chip has a plurality of contacts 118 at its front surface and an edge surface 120 which extends away from the front surface of such chip. Each chip also has a rear surface 122 opposite from its front surface 114.

Although the front surfaces of each of the chips in the chip stack are shown all oriented in the same direction in FIG. 1, the front surfaces of one or more of the chips in the stack can be oriented in the opposite direction such that the front surfaces of at least two of the chips which are adjacent one another would either face each other or would face in opposite directions away from one another.

In the example seen in FIG. 1, the chip stack 110 includes a dielectric region 115 that extends between the front surface 114-1 of a first chip 112-1 and a front surface or a rear surface 122-2 of a second chip 112-2 that is adjacent to the first chip in the chip stack. Such dielectric regions are disposed between adjacent surfaces of other chips in the chip stack depicted in FIG. 1. The dielectric region may include one or more adhesive layers or other dielectric material. Typically, the dielectric region includes at least adhesive layers coupled to each of the opposed front or rear surfaces of adjacent chips in the chip stack. In one embodiment, the dielectric region includes one or more layers of polyimide or other polymeric material.

The chip stack also includes a plurality of electrically conductive chip terminals 124 each coupled with a contact 118 on one of the chips and which extends in a direction generally parallel to the front surface 114 towards an edge surface 120 of the respective chip.

As depicted in FIG. 1, each of the chip terminals may extend from a contact 118 that is disposed adjacent an edge surface 120 which faces a major surface 134 of a substrate 130. The substrate 130 can be formed of various materials, which may or may not include a polymeric component, and may or may not include an inorganic component, or alternatively may be wholly or essentially polymeric or may be wholly or essentially inorganic. In various non-limiting examples, the substrate can be formed of a composite material such as glass-reinforced epoxy, e.g., FR-4, a semiconductor material, e.g., Si or GaAs, or glass or ceramic material. The chip terminals may be elongated in a direction extending towards the edge surface 120. In some cases, all the chip terminals can extend from contacts 118 to locations adjacent to, or beyond only the edge surfaces 120 which face the major surface 134 of the substrate.

In one example, the chip terminals 124 are defined by deposited electrically conductive traces or pads of a redistribution layer coupled to the contacts 118. Alternatively, each chip terminal may be defined by a trace extending from an individual contact and terminating in a pad at an end remote from the contact. In another example, as seen in FIG. 1, chip terminals 124 can be defined by an extruded wire element such as a wire bond, which in some cases may further include an electrically conductive material deposited thereon, as further described below. Additionally or alternatively, other electrically conductive structures or materials such as conductive leads or ribbons, conductive masses, conductive pillars, stud bumps or other suitable electrically conductive material may be used to couple contacts 118 to substrate contacts 132. The electrically conductive material may be deposited by plating or depositing a metal or other conductive material, or alternatively by depositing an electrically conductive ink or an electrically conductive polymer material, onto an exposed surface of the respective contact 118 and optionally onto surfaces of dielectric material between adjacent chips. In another example, chip terminals 124 can be lead portions of a leadframe which may be electrically connected to contacts 118 by electrically conductive bumps such as masses of solder, tin, indium or eutectic material, or drops or droplets of electrically conductive polymer material or electrically conductive ink, the lead portions severed from the leadframe before forming connections with the substrate. Such lead portions may alternatively be coupled to contacts 118 of a chip through electrically conductive traces or pads of a redistribution layer coupled with the contacts 118.

The assembly further includes a substrate 130 having a plurality of substrate contacts 132 at a major surface 134 thereof. Substrate 130 may be organic substrate or semiconducting materials like Si, GaAs, etc. As seen in FIG. 1, the parallel planes 116-x defined by the front surfaces of the chips 114 are oriented transverse to, i.e., in a direction non-parallel to, a plane 136 defined by the major surface 134 of the substrate.

The chips in the chip stack are electrically coupled with the substrate contacts 132 via an electrically conductive material 138 coupling the chip terminals 124 with corresponding substrate contacts 132. Here, the conductive material 138 can be in form of electrically conductive bumps such as masses of solder, tin, indium or eutectic material, or drops or droplets of electrically conductive polymer material or electrically conductive ink on surfaces of the substrate contacts and the chip terminals 124.

In the example shown in FIG. 1, an encapsulant region 140, which may be or may include a molded dielectric region can overlie an edge surface 120 of at least some of the chips. In one example, such encapsulant region may be comprised of a polymeric dielectric material, or alternatively a polymeric dielectric material with a filler therein which may have a lower coefficient of thermal expansion than the polymeric material. In some examples, the filler may include particles, flakes or a mesh or scaffold of an inorganic material such as a glass, quartz, ceramic or semiconductor material, among others.

As illustrated in FIG. 1, the parallel planes 116-x may be oriented in a direction orthogonal to the plane 136 of the substrate major surface. FIG. 1 shows an example in which the major surface of the substrate faces the edge surfaces 120 of each chip. The microelectronic assembly may further include a reinforcing material such as an underfill 142 surrounding individual connections between the chip terminals 124 and the substrate contacts 132.

In a variation of the embodiment described above with respect to FIG. 1, each chip 112 can be disposed in an orthogonal orientation above the substrate major surface 134 but without a dielectric material providing attachment between adjacent chips. In such case, the chips can be maintained in position at their mountings to the substrate 130, or in some cases by other structure such as a frame coupled to the chips at one or more edge surfaces 220 which face away from the substrate.

Figure 2:
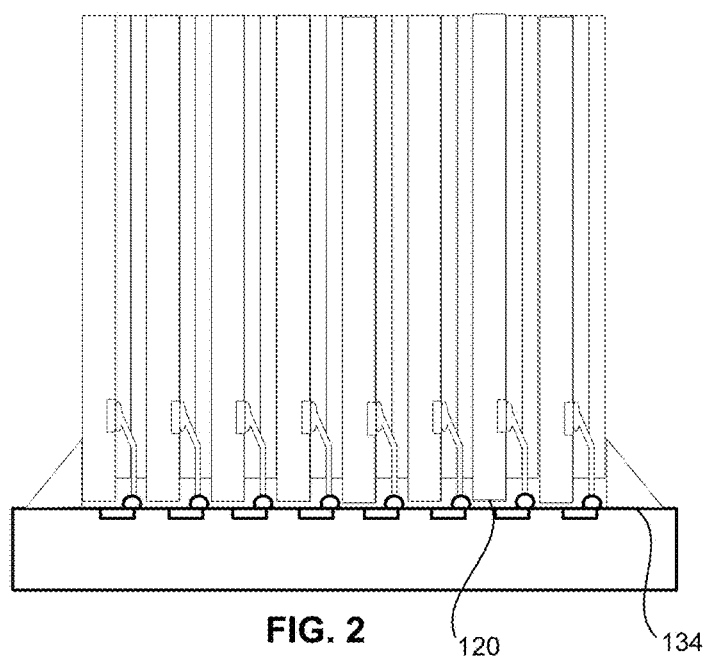
FIG. 2 is a sectional view depicting a microelectronic assembly in accordance with one embodiment of the invention.

Referring to FIG. 2, in a variation of the embodiment seen in FIG. 1, the edge surfaces 120 of the chips 112 are free from a dielectric region molded onto the edge surfaces. FIG. 2 depicts an example in which edge surfaces 120 of the chips, free of such molded dielectric region, are abutted or otherwise positioned so as to face the major surface 134 of the substrate.

Figure 3:
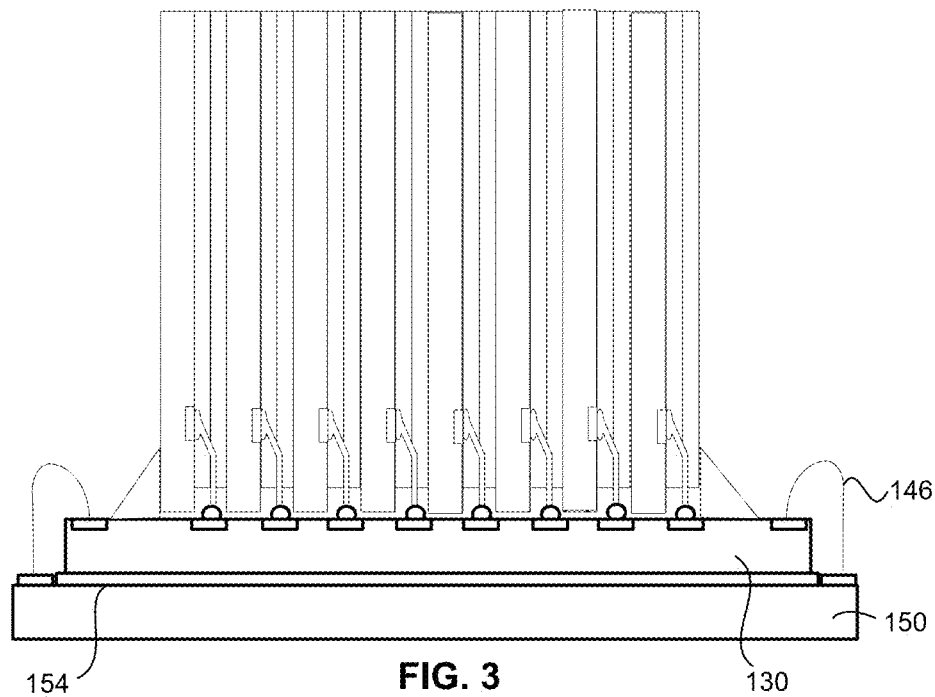
FIG. 3 is a sectional view depicting a microelectronic assembly in accordance with one embodiment of the invention.

In one embodiment, such as seen in FIG. 3, the substrate 130 may overlie or be mounted to a further component such as a circuit panel 150, to which it may be electrically coupled. In some cases, the substrate may function as a coefficient of thermal expansion ("CTE") buffer between relatively low CTE chips in the chip stack and a circuit panel which has a higher CTE. Thus, referring to FIG. 3, in one embodiment, the substrate 130 can be mounted to a circuit panel 150 having greater than 40% polymeric material content and having a coefficient of thermal expansion ("CTE") of greater than 10 parts per million per degree Celsius ("ppm/° C."). In such case, the substrate can overlie the major surface 154 of the circuit panel and be electrically interconnected therewith, such as through wire bonds 146. In some cases, the substrate 130 may be a passive substrate or active chip, e.g., controller chip for multiple NAND die. In other cases, the substrate 130 may be a wafer level package which includes a semiconductor chip having active devices thereon, or the substrate may be a fan out wafer level package which includes a semiconductor chip having active devices thereon.

Figure 4:
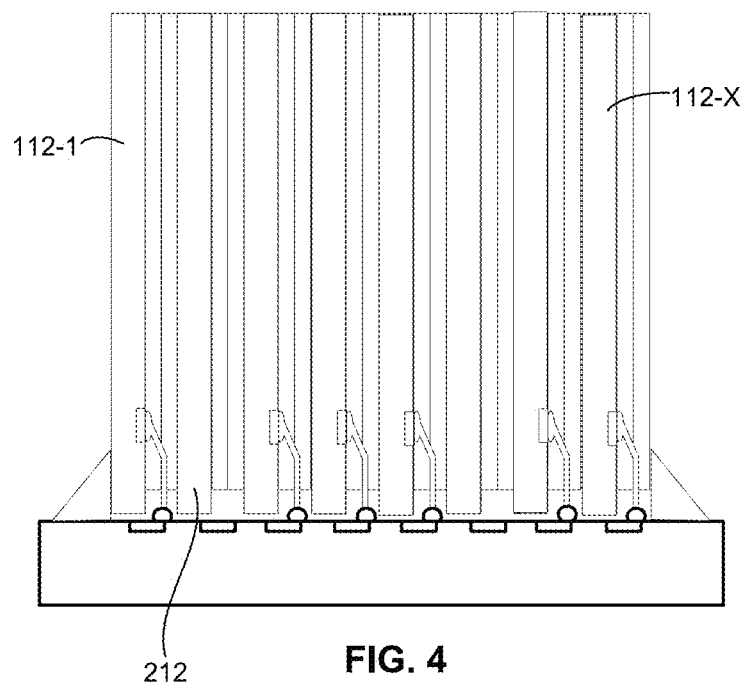
FIG. 4 is a sectional view depicting a microelectronic assembly in accordance with one embodiment of the invention.

Referring to FIG. 4, in some cases the microelectronic assembly can include at least one dummy chip 212 or spacer element which overlies a front surface or a rear surface of a chip 112 of the plurality of chips but which may not be electrically coupled to contacts at the substrate major surface. In one example, a spacer or dummy chip 212 is not electrically coupled with other chips in the chip stack or with the substrate. In a particular example, one or more such dummy chips can be interposed between chips among the plurality of chips. In one embodiment, one or more dummy chips or spacers can be provided above the topmost or the bottommost chips 112-1, 112 in the stack, and may sandwich the other chips between them. In another embodiment, spacer 212 may act as a heat spreading material, e.g. copper.

Figure 5:
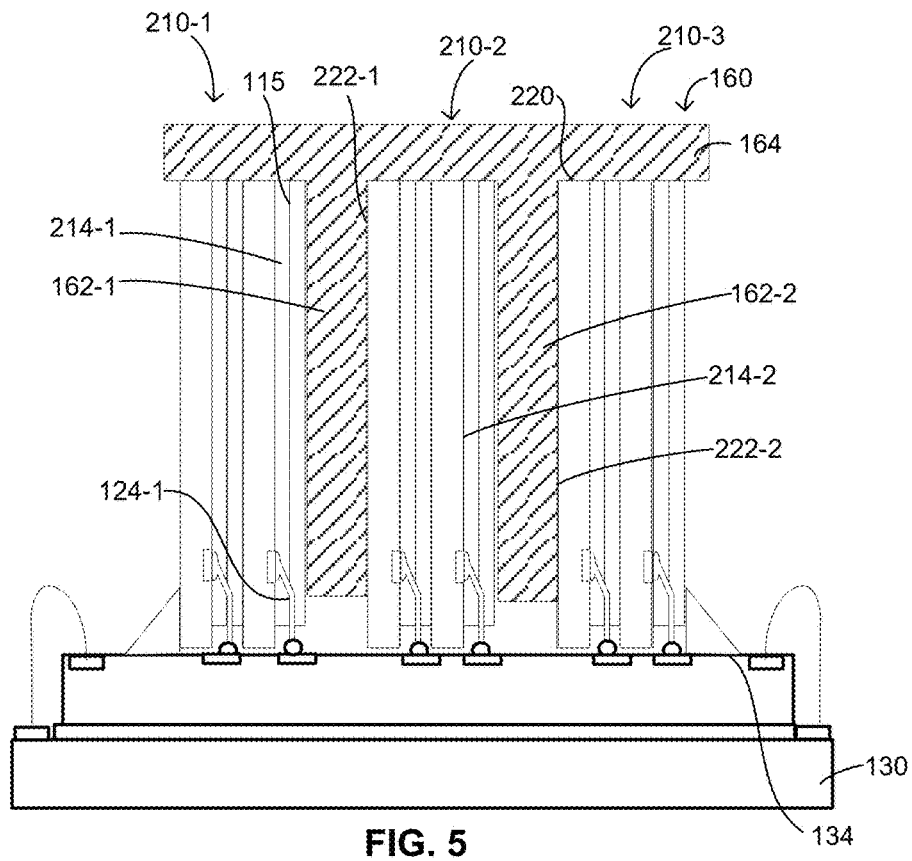
FIG. 5 is sectional view depicting a microelectronic assembly in accordance with an embodiment of the invention further including an additional thermally conductive element.

Referring to FIG. 5, in one embodiment, the microelectronic assembly includes one or more such chip stacks which are disposed at least generally parallel to one another above the major surface 134 of the substrate 130. A heat spreader 160 having one or more thermally conductive portions 162-1, 162— may be disposed between the adjacent front or rear surfaces of chips of at least two chips or chip stacks on the substrate. In the example of FIG. 5, a microelectronic assembly is shown having first, second and third chip stacks 210-1, 210-2 and 210-3. A first thermally conductive portion 162-1 is disposed between the front surface 214-1 of a chip of the first chip stack 210-1 and an adjacent rear surface 222-1 of a chip of the second chip stack 210-2, with the front surface 214-1 and rear surface 222-1 being parallel to one another. The dielectric region 115 may extend from the front surface 214-1 to the thermally conductive portion 162-1 and may include an adhesive which bonds the front surface 214-1 thereto. As seen in FIG. 5, the dielectric region 115 may also provide electrical insulation between a chip terminal 124-1 and the adjacent thermally conductive portion 162-1. A second thermally conductive portion 162-2 is disposed between the front surface 214-2 of a chip of the second chip stack 210-2 and an adjacent rear surface 222-2 of a chip of the third chip stack 210-2, with the front surface 214-2 and rear surface 222-2 being parallel to one another. Of course, the thermally conductive portions, e.g., 162-1, 162-2, may be provided with different configurations, e.g., between chips which are oriented with their back surfaces facing one another, and/or in some cases, can be provided with various air gap configurations between the thermally conductive portion or member and the chips, etc.

With continued reference to FIG. 5, the microelectronic assembly may include a thermally conductive member 164 which overlies edge surfaces 220 of chips of one or more chip stacks, which edge surfaces 220 are opposite from the edge surfaces 120 adjacent to the substrate. In one embodiment, thermally conductive portions, e.g., 162-1, 162-2, which are disposed between adjacent chip stacks 210-1, 210-2, and 210-3, can be thermally connected with or integral with the thermally conductive member 164.

Figure 6:
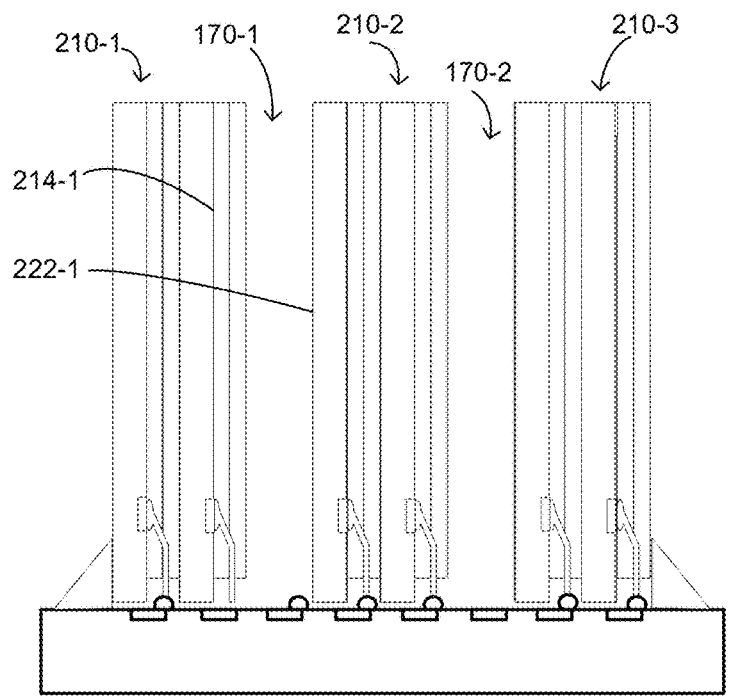
FIG. 6 is sectional view depicting a microelectronic assembly in accordance with an embodiment of the invention further including an air gap.

As seen in FIG. 6, in a variation of that shown in FIG. 5, the assembly may include air gaps between adjacent chips or adjacent chip stacks. For example, as seen in FIG. 6, a first air gap 170-1 is disposed between the front surface 214-1 of a chip of the first chip stack 210-1 and an adjacent rear surface 222-1 of a chip of the second chip stack 210-2, with the front surface 214-1 and rear surface 222-1 being parallel to one another. A second air gap 170-2 is disposed in like manner between the second and third chip stacks 210-2, 210-3. In particular embodiments, the air gaps may provide space for ventilation or may improve electromagnetic isolation or other aspects of operation.

Figure 7:
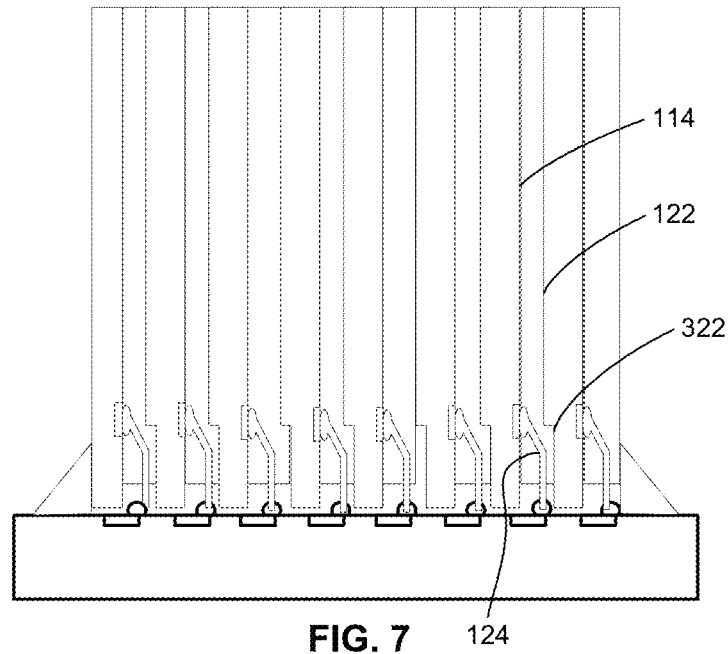
FIG. 7 is a sectional view depicting a microelectronic assembly in accordance with one embodiment of the invention.

In one embodiment, as seen in FIG. 7, portions 322 of the rear surfaces 122 of chips which are aligned with and adjacent to at least some of the chip terminals 124 can be recessed relative to other portions of the rear surfaces. In this way, improved clearance can be provided above the chip terminals 124 to accommodate chip terminals 124 which are larger or extend higher above the front surface 114 of the chip to which they are connected. Moreover, the structure in FIG. 7 can help reduce the thickness of the stack in the direction orthogonal to the front surfaces 114 of the chips.

Figure 8:
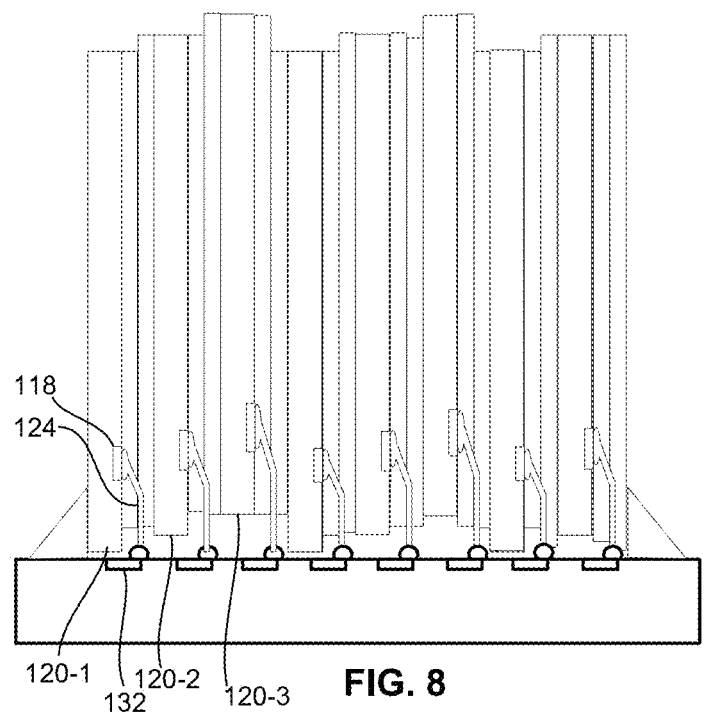
FIG. 8 is a sectional view depicting a microelectronic assembly in accordance with one embodiment of the invention in which chips are staggered.

In one embodiment, as seen in FIG. 8, the edge surfaces 120-1, 120-2, 120-3, etc., of adjacent chips in a chip stack can be staggered relative to one another. In such case, the chip terminals 124 can be lengthened in a direction from the contacts 118 toward the substrate 130 to permit connection with the substrate contacts 132. In another embodiment, the chip terminals 124 can be all of the same or similar length and the adjacent chips can be staggered in a direction parallel to the major surface of the substrate 130 such that second edge surfaces of first and second chips which have major dimensions extending in a same direction away from the substrate, i.e., such as in the orthogonal direction away from the substrate, are staggered relative to one another. In such case, the first and second edge surfaces are aligned with first and second different positions on the substrate major surface which are displaced from one another in a direction that is parallel to the parallel planes.

Figure 9:
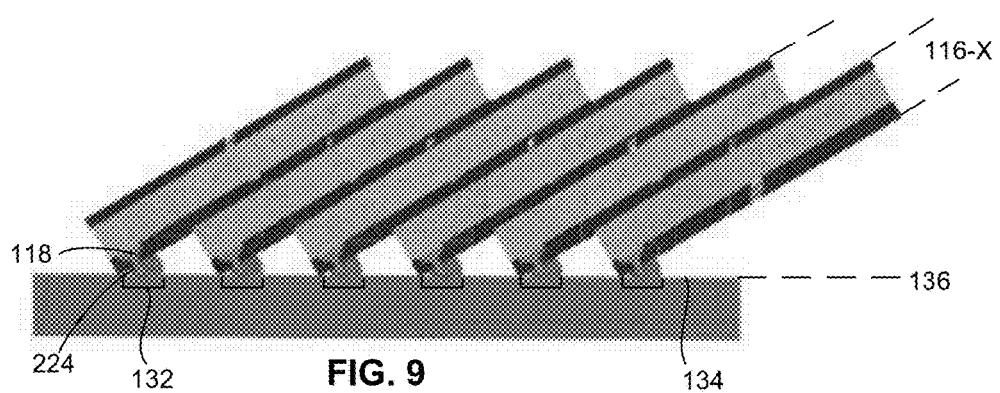
FIG. 9 is a sectional view depicting a microelectronic assembly in accordance with one embodiment of the invention in which the edge surfaces of chips are oriented at a non-orthogonal angle relative to a major surface of a substrate.
Figure 9A:
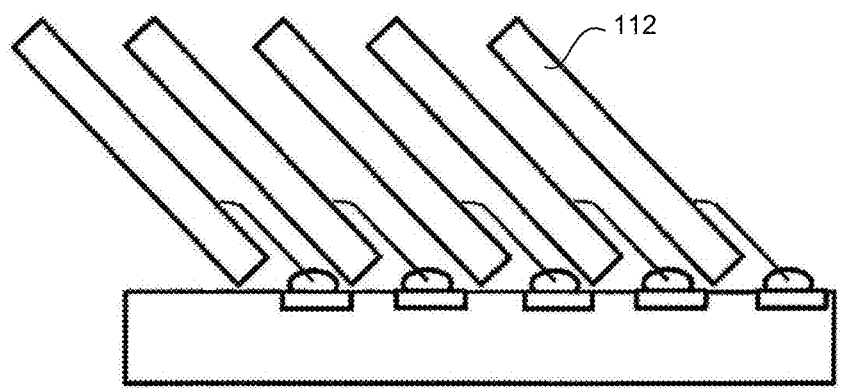
FIG. 9A is a sectional view depicting a microelectronic assembly in accordance with an embodiment of the invention in which the edge surfaces of chips are oriented at a non-orthogonal angle relative to a major surface of a substrate.

FIG. 9 illustrates a further variation, in which the chip stack is arranged at a non-orthogonal tilt angle relative to the substrate major surface 134. Stated another way, a plane 136 defined by the major surface of the substrate is oriented in a non-orthogonal direction relative to the parallel planes 116-x of the front surfaces of the chips. FIG. 9 depicts an embodiment in which the chip terminals 224 can be made smaller. In some cases, connections between the substrate contacts 132 and the chip terminals 224 can be made at locations overlying respective contacts 118 of the chips. Alternatively, as seen in FIG. 9A, the chip stack could be arranged with the front surfaces of the chips 112 facing up rather than down as in FIG. 9. In such case, the contacts can be electrically coupled with the substrate contacts in a manner similar to that shown in FIG. 1.

Figure 10:
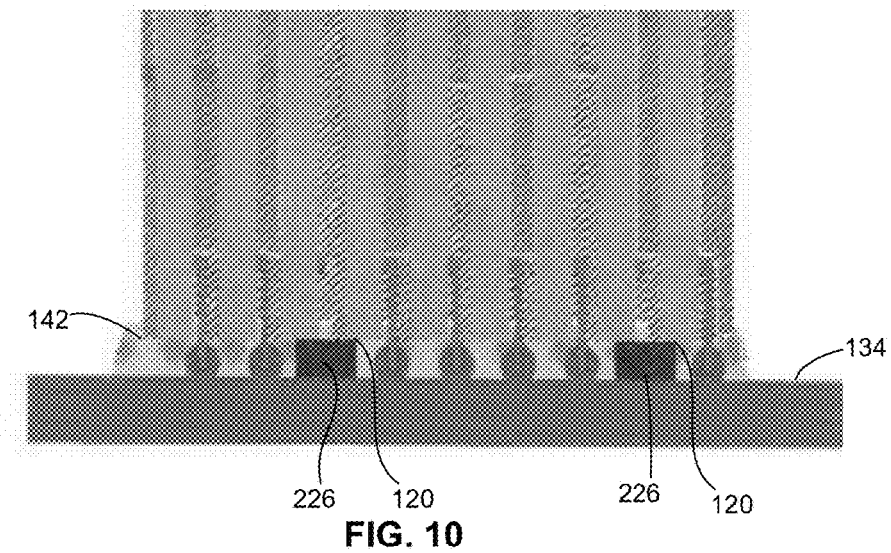
FIG. 10 is a sectional view depicting a microelectronic assembly in accordance with one embodiment of the invention in which spacers are disposed between end surfaces of chips and a substrate.

In one embodiment, shown in FIG. 10, the microelectronic assembly may include spacers 226 which are disposed between the edge surfaces 120 of at least some of the chips and the major surface 134 of the substrate. The spacers 226 may facilitate forming flip-chip style connections between the chip terminals and the substrate contacts which directly face the ends of the chip terminals. For example, the spacers 226 may provide a uniform spacing between the edge surfaces 120 of the chips in the chip stack and the substrate major surface 134 to facilitate connections between each chip and the corresponding substrate contact. In addition, the spacers 226 can help maintain spacing between the edge surfaces 120 and the major surface to accommodate an insulating encapsulant or underfill material 142.

Referring again to FIG. 1, a method will now be described for fabricating a microelectronic assembly such as described above. In one embodiment, the method is carried out by forming a chip stack 110 which includes a plurality of semiconductor chips 112 such that front surfaces 114 of the chips define respective parallel planes, wherein each chip has a plurality of contacts 118 at its front surface and an edge surface 120 extending away from the front surface of such chip. A plurality of chip terminals 124 can extend from contacts on each of the chips and having ends at an edge surface of a dielectric region disposed between surfaces of chips which are immediately adjacent to one another in the chip stack. Electrical connections are then formed between the chip terminals 124 and corresponding substrate contacts 132 at a major surface 134 of a substrate 130, wherein the major surface defines a second plane 136 which is transverse to the plurality of parallel planes. Typically, the electrical connections are formed using an electrically conductive material as described above which contacts the chip terminals and the corresponding substrate contacts.

Figure 11:
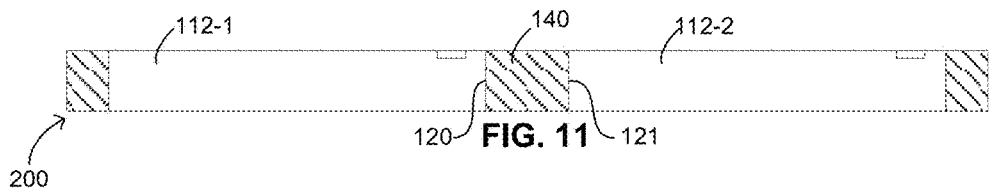
FIGS. 11, 12, 13A, 14, 15 and 16 are each a sectional view depicting a stage in a method of fabricating a microelectronic assembly in accordance with one embodiment of the invention.

Referring now to FIG. 11, stages in a method of fabricating a microelectronic assembly will now be described. As seen in FIG. 11, semiconductor chips can be placed together in an array and a molded region such as a dielectric encapsulant region can be formed extending between edge surfaces 120 of each chip and adjacent edge surfaces 121 of other chips to form a reconstituted wafer 200 or panel. In some cases, the chips 112-1, 112-2 may already be known to meet particular acceptance criteria, or may have been tested, and can be referred to as "known good dies" 112-1, 112-2, etc. The reconstituted wafer can thus include an M×N array of such chips arranged having at least one row and a plurality of columns, i.e., M being "one or more", and N being "greater than one". In some cases, M and N may each be greater than six.

Figure 12:
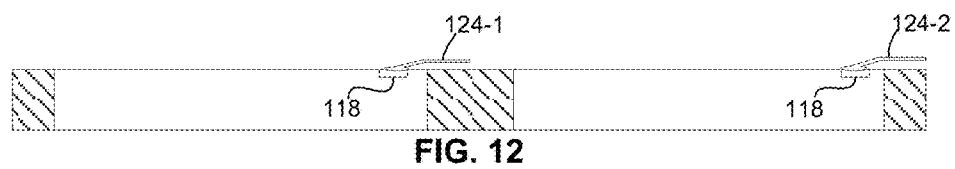

Referring to FIG. 12, chip terminals 124-1, 124-2 can be formed which extend from the contacts 118 of the semiconductor chips. For example, wire bonds can be formed on contacts 118 such as by ball bonding, folded ball bonding or wedge-bonding or other technique in which an edge surface of the wire is embedded in a contact 118 to form the chip terminals. For example, an edge surface of the wire can be dragged along the surface of a contact which contact is in form of a pad to embed the wire therein.

Alternatively, lead frame technology may be used to form terminals 124 as described above. In another example, any of the interconnect terminal arrangements or other arrangements disclosed in U.S. Pat. No. 8,723,332 (e.g., FIGS. 1A through 3F), U.S. Pat. No. 8,704,379 or U.S. Pat. No. 8,629,543, and any of the various terminal structures and methods for providing terminals disclosed in U.S. Pat. No. 8,551,815 can be utilized for providing the chip terminals 124 in the various embodiments disclosed herein. The disclosures of said U.S. Patents are incorporated by reference herein.

Figure 13A:
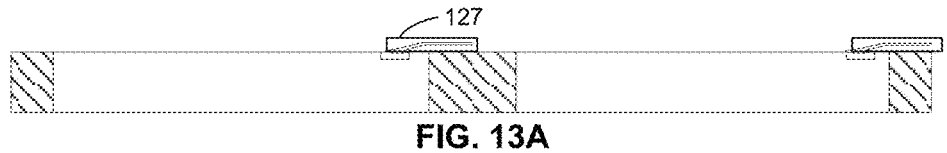

Referring to FIG. 13A, subsequently and optionally, a further electrically conductive material 127 can be deposited on the wire bonds to enlarge or in some cases, to increase the rigidity of the chip terminals.

Figure 13B:
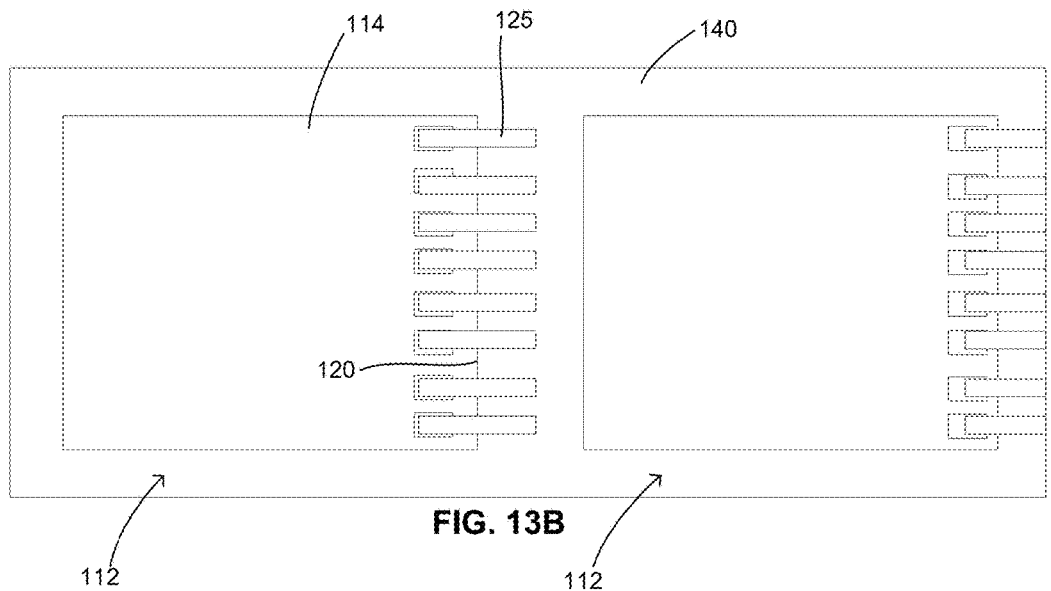
FIG. 13B is a plan view looking towards a front surface of a reconstituted wafer at a stage of fabricating a microelectronic assembly in accordance with one embodiment of the invention.

Alternatively, as seen in FIG. 13B, chip terminals 125 can be electrically conductive portions of a redistribution layer that is formed by depositing an electrically conductive material atop the front surface 114 of each chip 112. For example, the chip terminals can be formed by one or more of plating or depositing a lead or trace structure extending from the contacts 118 towards or beyond the edge surface 120 of each chip and onto a surface of encapsulant region 140.

Figure 14:
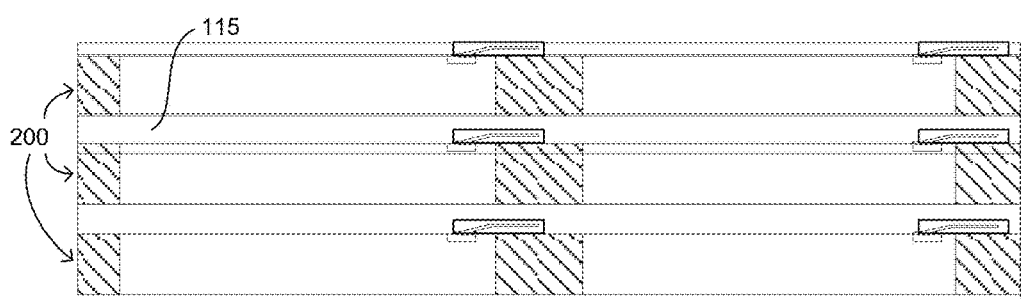

Next, as seen in FIG. 14, a plurality of such reconstituted wafers 200 can be stacked one atop the other with a dielectric region 115 such as an adhesive between adjacent surfaces of the chips of each respective reconstituted wafer 200.

Figure 15:
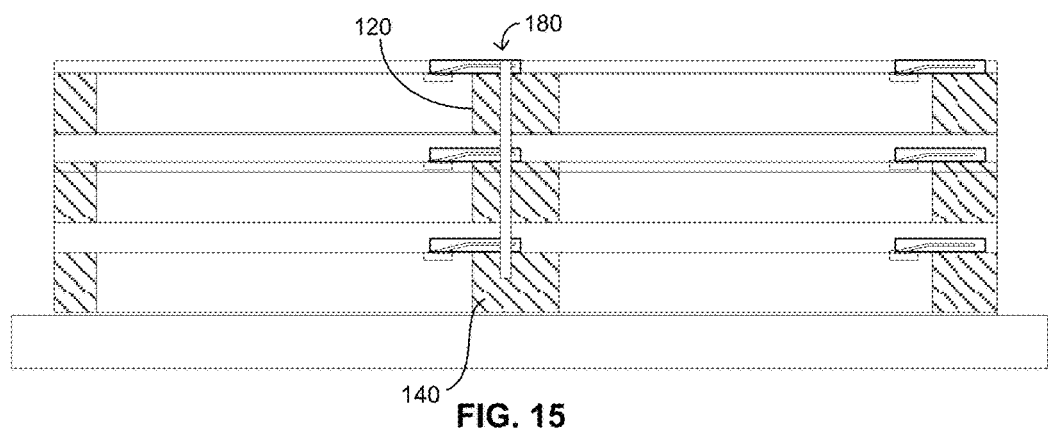

Referring to FIG. 15, a process is applied to cause a surface of the dielectric region 115 disposed between adjacent chip surfaces to be recessed, so as to expose surfaces of the chip terminals which extend in a lengthwise direction of the chip terminals. For example, as seen in FIG. 15, the stacked assembly of reconstituted wafers 200 can be partially severed using a saw or laser or etching along lines 180 which extend parallel to end surfaces 120 of the chips therein. At such time, chips in at least one of the reconstituted wafers can remain mechanically bound with one another by the encapsulant region 140 therein.

Figure 16:
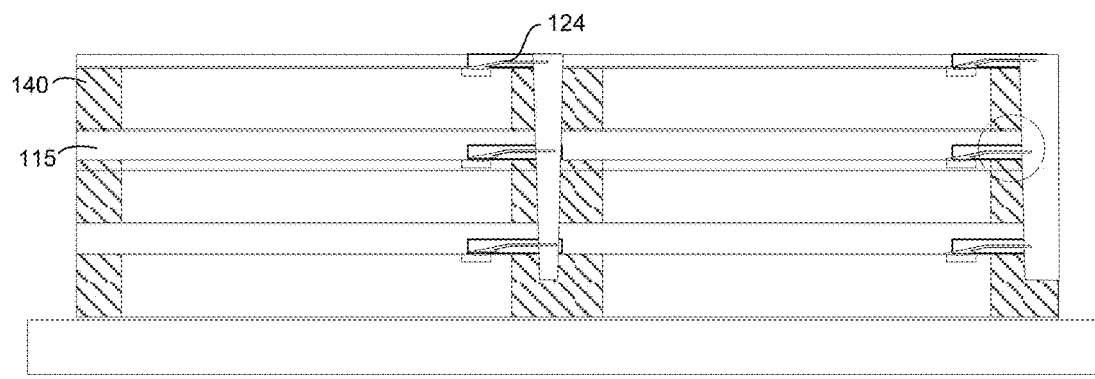

Thereafter, as seen in FIG. 16, a process may be applied to remove material of the dielectric region at ends of the chip terminals 124. In one example, the dielectric region 115 including the encapsulant region 140 can be recessed by a removal process which may involve a chemical and/or an abrasive component. The dielectric and encapsulant regions may be recessed non-selectively as seen in FIG. 16.

Figure 17:
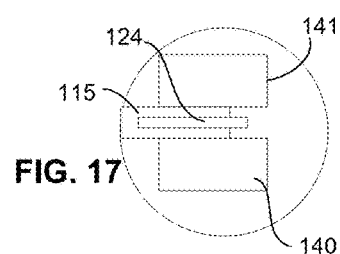
FIG. 17 is a fragmentary partial sectional view illustrating a chip terminal and adjacent structure in a chip stack of a microelectronic assembly in accordance with one embodiment of the invention.

In a particular embodiment, referring to the fragmentary partial sectional view of FIG. 17, the chip terminals 124 may not extend as far as an edge surface 141 of the encapsulant regions 140 on the chips immediately adjacent to the chip terminal. In addition, as seen in FIG. 17, the dielectric region 15 and encapsulant region 140 can be recessed by a process which is selective to the material of the encapsulant region, such that the dielectric region 115 in the immediate vicinity of each chip terminal is recessed to a greater extent than the encapsulant region.

Figure 18:
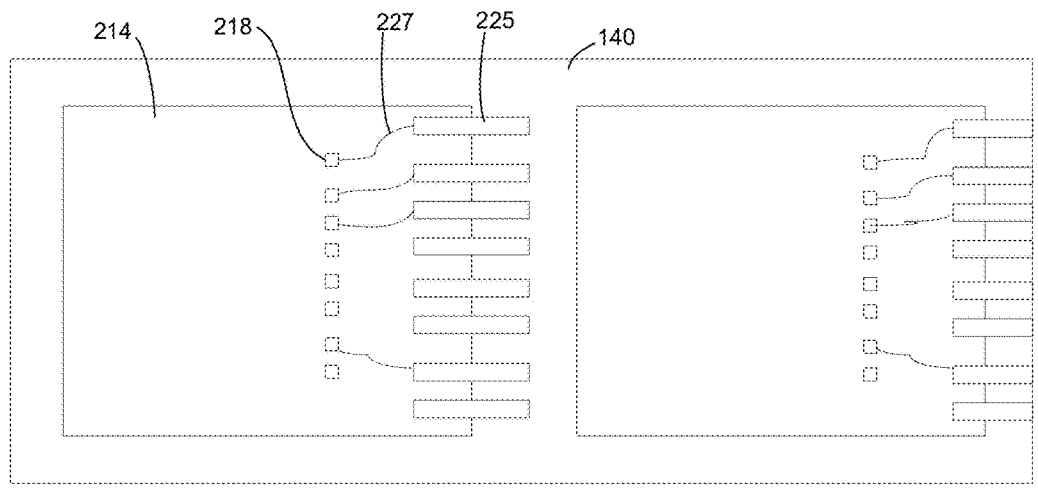
FIG. 18 is a plan view looking towards a front surface of a reconstituted wafer at a stage of fabricating a microelectronic assembly in accordance with one embodiment of the invention.

In one embodiment as seen in FIG. 18, a reconstituted wafer can be formed in which the chip terminals 225 are portions of an electrically conductive redistribution layer formed atop the front surface 214 of each chip. For example, as seen in FIG. 18, the redistribution layer can include the chip terminals 225 and electrically conductive traces 227 which extend from the contacts 218 of the semiconductor chip. In such case, the redistribution layer so formed defines the ends of the chip terminals. The redistribution layer can be formed after forming the encapsulant region 140 in a manner as described above.

In another example, the chip terminals can include wire bonds similar to those of FIG. 12, but which extend from redistribution contacts formed on the chip or on a surface of the encapsulant region 140.

Further variations and embodiments of wafer-level packages and fan-out wafer-level packages which can be utilized as the chips 112 and/or to form structures as described herein can be as described in U.S. Pat. Nos. 7,901,989 and 8,431,435, the disclosures of which are incorporated by reference herein.

Although the invention has been described with reference to the foregoing description and Figures, many modifications and enhancements are possible. The invention shall not be limited except in accordance with the claims appended herein or which may be derived from the present disclosure.

Although not specifically shown in the Figures or particularly described in the foregoing, elements in the various Figures and various described embodiments can be combined together in additional variations of the invention.

The invention claimed is:

1. A microelectronic assembly, comprising:
a chip stack comprising a plurality of semiconductor chips having front surfaces, each front surface defining a respective plane of a plurality of planes, each chip having a plurality of contacts at the front surface, and an edge surface extending away from its front surface;
a plurality of chip terminals each electrically coupled with a contact of a chip of the plurality of chips and extending in a direction towards the edge surface of the respective chip;
a substrate having a plurality of substrate contacts at a major surface thereof, the major surface defining a second plane non-parallel to the plurality of parallel planes, wherein the chip stack is mounted to the substrate with the edge surfaces of the chips towards the major surface;
an electrically conductive material electrically connecting the chip terminals with corresponding substrate contacts; and
a reinforcing underfill material surrounding individual connections between the chip terminals and the substrate contacts,
wherein one or more of the chips in the chip stack each has an encapsulant region extending in a lateral direction beyond the edge surface of the chip and at least partially extending into the reinforcing underfill material.

2. The microelectronic assembly as claimed in claim 1, wherein the chip terminals are wire bonds.

3. The microelectronic assembly as claimed in claim 1, wherein the parallel planes are oriented in a direction orthogonal to the second plane.

4. The microelectronic assembly as claimed in claim 1, wherein the edge surfaces of the chips are uncovered by a dielectric region extending between the front surface of a first chip of the plurality of chips and a front surface or a rear surface of a second chip of the plurality of chips adjacent to the first chip in the chip stack.

5. The microelectronic assembly as claimed in claim 1, further comprising a circuit panel having greater than 40% polymeric material content and having a coefficient of thermal expansion ("CTE") of greater than 10 parts per million per degree Celsius ("ppm/° C."), the substrate overlying a surface of the circuit panel and electrically interconnected therewith.

6. The microelectronic assembly as claimed in claim 1, wherein the chip stack includes a first chip and a second chip, the assembly further comprising a heat spreader having a thermally conductive portion disposed between a front or rear surface of the first chip and an adjacent front or rear surface of the second chip.

7. The microelectronic assembly as claimed in claim 1, further comprising a thermally conductive member overlying second edge surfaces of at least some of the chips which are opposite from the edge surfaces which face the substrate.

8. The microelectronic assembly as claimed in claim 1, wherein at least one air gap is disposed between adjacent chips.

9. The microelectronic assembly as claimed in claim 1, wherein second edge surfaces of the first and second chips which have major dimensions extending in a same direction away from the substrate are staggered relative to one another such that the first and second edge surfaces are aligned with first and second different positions on the substrate major surface which are displaced from one another in a direction parallel to the parallel planes.

10. The microelectronic assembly as claimed in claim 1, wherein the second plane is oriented in a non-orthogonal direction to the parallel planes.

11. The microelectronic assembly as claimed in claim 1, further comprising a plurality of spacers disposed between the edge surfaces of at least some of the chips and the major surface of the substrate.

12. A microelectronic assembly, comprising:
a chip stack comprising a plurality of semiconductor chips having front surfaces, each front surface defining a respective plane of a plurality of planes, each chip having a plurality of contacts at the front surface, and an edge surface extending away from its front surface;

a plurality of chip terminals each electrically coupled with a contact of a chip of the plurality of chips and extending in a direction towards the edge surface of the respective chip;

a substrate having a plurality of substrate contacts at a major surface thereof, the major surface defining a second plane non-parallel to the plurality of parallel planes, wherein the chip stack is mounted to the substrate with the edge surfaces of the chips towards the major surface;

an electrically conductive material electrically connecting the chip terminals with corresponding substrate contacts; and a reinforcing underfill material surrounding individual connections between the chip terminals and the substrate contacts, wherein the edge surfaces of the first and second chips are staggered relative to one another such that an edge surface of the second chip is disposed at a greater distance from the substrate major surface than the edge surface of the first chip.

* * * * *